(12) United States Patent
Eto

(10) Patent No.: US 8,042,013 B2
(45) Date of Patent: Oct. 18, 2011

(54) SEMICONDUCTOR DEVICE AND VERIFY METHOD FOR SEMICONDUCTOR DEVICE

(75) Inventor: Kimiharu Eto, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 230 days.

(21) Appl. No.: 12/320,575

(22) Filed: Jan. 29, 2009

(65) Prior Publication Data

US 2010/0131811 A1    May 27, 2010

(30) Foreign Application Priority Data

Nov. 27, 2008    (JP) .................................. 2008-302752

(51) Int. Cl.
*G11C 29/00*    (2006.01)
(52) U.S. Cl. ........................................ 714/721; 714/719
(58) Field of Classification Search .................. 714/719, 714/721
See application file for complete search history.

(56) References Cited

U.S. PATENT DOCUMENTS

| | | | | |
|---|---|---|---|---|
| 4,084,262 | A * | 4/1978 | Lloyd et al. ...................... 714/47 |
| 4,631,724 | A * | 12/1986 | Shimizu ......................... 714/718 |
| 5,848,076 | A * | 12/1998 | Yoshimura ..................... 714/763 |
| 5,864,566 | A * | 1/1999 | Sanada .......................... 714/736 |
| 6,014,332 | A * | 1/2000 | Roohparvar ............. 365/185.33 |
| 6,144,887 | A * | 11/2000 | Kamiya et al. .................. 700/79 |
| 6,215,324 | B1 * | 4/2001 | Yoshida .................... 324/750.05 |
| 6,222,779 | B1 | 4/2001 | Saito et al. |
| 6,288,940 | B1 * | 9/2001 | Kawamura ............... 365/185.09 |
| 6,385,112 | B1 | 5/2002 | Kurosaki |
| 6,707,835 | B2 | 3/2004 | Matumoto |
| 6,845,047 | B2 * | 1/2005 | Ikehashi et al. .......... 365/189.15 |
| 7,200,066 | B2 * | 4/2007 | Krenzke et al. ............... 365/226 |
| 7,245,547 | B2 * | 7/2007 | Kim et al. ..................... 365/226 |
| 7,376,023 | B2 * | 5/2008 | Umezawa ................ 365/189.09 |
| 7,409,590 | B2 * | 8/2008 | Moshayedi et al. ............ 714/20 |
| 7,596,036 | B2 | 9/2009 | Kondo et al. |
| 7,653,846 | B2 * | 1/2010 | Kim et al. ..................... 714/718 |
| 2008/0283876 | A1 | 11/2008 | Souda |

FOREIGN PATENT DOCUMENTS

| | | |
|---|---|---|
| JP | 3-46196 A | 2/1991 |
| JP | 11-306774 | 11/1999 |
| JP | 2002-133886 A | 5/2002 |
| JP | 2007-334813 A | 12/2007 |
| JP | 2008-283122 A | 11/2008 |

* cited by examiner

*Primary Examiner* — James C Kerveros
(74) *Attorney, Agent, or Firm* — Foley & Lardner LLP

(57) ABSTRACT

A semiconductor device includes a memory module provided with a plurality of memory cells, a verify determination unit that performs quality determination of read data that have been read from the memory cells on the basis of the read data and an expected value prepared in advance, and a power source monitoring circuit that detects fluctuations equal to or greater than a predetermined variation rate in a power source voltage supplied to the memory module and outputs a power source abnormality detection signal. Furthermore, the verify determination unit invalidates a result of the quality determination when the power source abnormality detection signal indicates an abnormal state of the power source voltage.

12 Claims, 7 Drawing Sheets

| MATCH RESULT | POWER SOURCE ABNORMALITY FLAG VALUE | CPU OPERATION |
|---|---|---|
| COINCIDENCE | 0 (NORMAL) | WRITE END |
| COINCIDENCE | 1 (ABNORMAL) | VERIFY RETRY |
| NO COINCIDENCE | 0 (NORMAL) | WRITE RETRY |
| NO COINCIDENCE | 1 (ABNORMAL) | VERIFY RETRY |

Fig. 4

SEMICONDUCTOR DEVICE AND VERIFY METHOD FOR SEMICONDUCTOR DEVICE

BACKGROUND

1. Field of the Invention

The present invention relates to a semiconductor device and a verify method for the semiconductor device, and more particularly relates to a semiconductor device having a memory module and determining whether a write operation to the memory module is normal by verify processing and to a verify method therefor.

2. Description of Related Art

A flash memory is has been widely used in recent years as a memory device (for example, a memory module) that is incorporated in a semiconductor device or attached externally thereto. Verify processing is performed to determine whether a write operation in a flash memory is normal. In the verify processing, write data to a memory module are taken as an expected value, read data that are obtained by reading again the written data are compared with the expected value, and whether the write operation is normal is determined by a match result of the write data and read data.

Japanese Unexamined Patent Application Publication No. H11-306774 discloses an example of a semiconductor memory device performing the verify processing. An example of processing flow (referred to hereinbelow as conventional verify processing flow) of verify processing of the semiconductor memory device disclosed in Japanese Unexamined Patent Application Publication No. H11-306774 is shown in FIG. 7. As shown in FIG. 7, in the conventional verify processing flow, a power source voltage supplied to a semiconductor memory device is detected (S101) prior to conducting the verify processing (steps S102 to S104). Then, verify processing (steps S102 to S104) is carried out, and when the verify result in step S104 indicates a no-good write (No branch of step S104), a retry write operation (steps S107 to S119) is performed. Where the verify result indicates a successful write (Yes branch of step S104), read setup processing is performed (S105) and the processing flow ends. Furthermore, when the verify result indicates a no-good write (No branch of step S104), where the number of cycles of retry write operation has reached a limit (Yes branch of step S105), the write operation is determined to be not good (step S120) and the processing is then ended via step S105.

Here, in the retry write operation in the conventional verify processing flow, a unit of write data to a memory cell is determined correspondingly to the power source voltage detected in step S101. In the conventional verify processing flow, the lower is the power source voltage, the smaller is the unit of write data that are written in one operation. In the example shown in FIG. 7, when the power source voltage is the lowest, write data to be written in one operation are taken as 4 bit and the write operation is performed in four cycles (steps S109 to S113). As the power source voltage increases, the bit number of write data is increased (steps S116 to S118 and step S119). In the conventional verify processing flow, the increase in write time at a low power source voltage is inhibited by controlling a unit of data during retry write operation correspondingly to the power source voltage.

SUMMARY

As described hereinabove, with the conventional verify processing flow described in Japanese Unexamined Patent Application Publication No. H11-306774, the write time during retry write can be inhibited. However, the present inventors have found that the following problem that is different from the write time problem is encountered in verify processing in a flash memory. This problem is that read data inversion occurs when power source fluctuations occur during verify processing and an erroneous verify determination is performed in a flash memory. However, in the conventional verify processing flow, a power source voltage is not monitored within a period of verify processing (steps S102 to S104). Therefore, reliability of verify processing affected by power source voltage fluctuations cannot be guaranteed and the above-described problem cannot be resolved.

A first exemplary aspect of an embodiment of the present invention is a semiconductor device including a memory module provided with a plurality of memory cells, a verify determination unit that performs quality determination of read data that have been read from the memory cells on the basis of the read data and an expected value prepared in advance, and a power source monitoring circuit that detects fluctuations equal to or greater than a predetermined variation rate in a power source voltage supplied to the memory module and outputs a power source abnormality detection signal. Furthermore, the verify determination unit invalidates a result of the quality determination when the power source abnormality detection signal indicates an abnormal state of the power source voltage.

A second exemplary aspect of an embodiment of the present invention is a verify method in a semiconductor device having a memory module provided with a plurality of memory cells, the method including a write step of inputting write data into the memory module and storing the write data in an expected value storage unit, a read step of reading read data corresponding to the write data, from the memory module a power source monitoring step of monitoring fluctuations of a power source voltage supplied to the memory module within a period of reading the read data, and a data comparison step of comparing for coincidence the read data and the write data stored in the expected value storage unit and performing quality determination of the read data. Furthermore, in the power source monitoring step, a result of the quality determination is invalidated when the power source voltage is detected to have fluctuations equal to or greater than a predetermined variation rate.

With the semiconductor device in accordance with the present invention and a verify method therefor, a power source abnormality detection signal that is outputted by a power source monitoring circuit is referred to when verify processing of read data in a verify determination unit is performed. Furthermore, when the power source abnormality detection signal indicates fluctuations equal to or greater than a predetermined variation rate of a power source voltage, the verify result is invalidated regardless of the read data quality result. In other words, with this semiconductor device and a verify method therefor, it is possible to detect power source voltage fluctuations during verify processing that decrease the reliability of read data quality determination results.

With the semiconductor device in accordance with the present invention and the verify method therefor, it is possible to increase the reliability of read data quality results determined by verify processing.

BRIEF DESCRIPTION OF THE DRAWINGS

The above and other exemplary aspects, advantages and features will be more apparent from the following description of certain exemplary embodiments taken in conjunction with the accompanying drawings, in which:

FIG. 4 shows a table illustrating the operations performed thereafter by the CPU that refers to the match result and the power source abnormality flag value in a semiconductor apparatus according to the first exemplary embodiment;

DETAILED DESCRIPTION OF THE EXEMPLARY EMBODIMENTS

First Exemplary Embodiment

Figure 1:
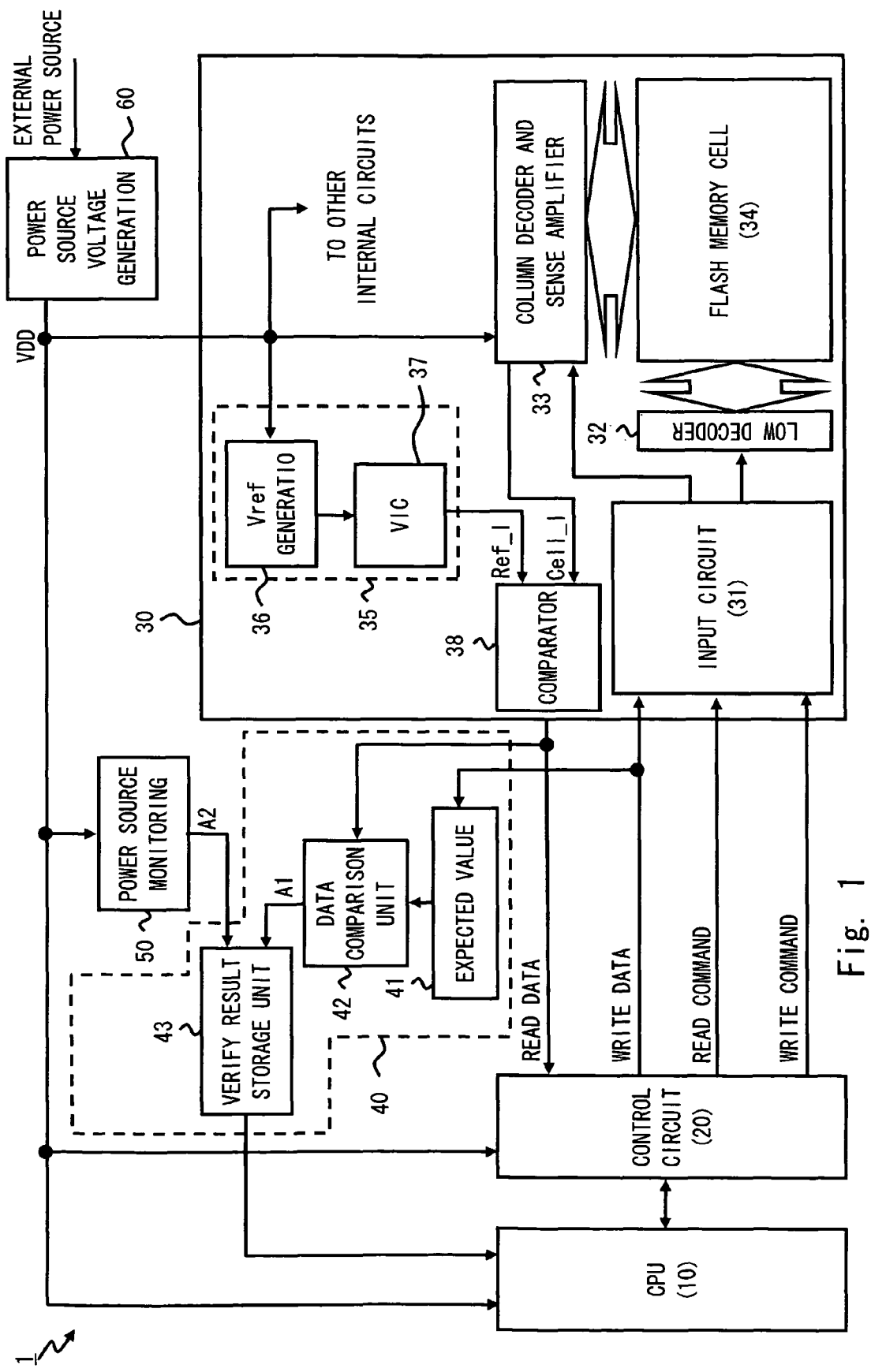
FIG. 1 shows a block diagram of a semiconductor apparatus according to a first exemplary embodiment.

The embodiments of the present invention will be described below with reference to the appended drawings. FIG. 1 shows a block diagram of a semiconductor device 1 of the present embodiment. The semiconductor device 1 shown in FIG. 1 is described as being formed on one semiconductor substrate, but the present invention may be also realized as a device in which respective structural elements are different.

As shown in FIG. 1, the semiconductor device 1 has an operational circuit (for example, a CPU) 10, a control circuit 20, a memory module 30, a verify determination unit 40, a power source monitoring circuit 50, and a power source voltage generation circuit 60.

The CPU 10 is the so-called microcomputer and performs processing of various kinds according to a program stored in the memory module 30 or another memory device (not shown in the figure). The control circuit 20 receives commands from the CPU 10 and controls a write operation or a read operation of the memory module 30.

The memory module 30 is a memory device including a flash memory cell. The memory module 30 has an input circuit 31, a low decoder 32, a column decoder and a sense amplifier 33, a flash memory cell 34, a reference voltage generation circuit 35, and a comparator 38.

The input circuit 31 receives a control signal (for example, a read command and a write command) from the control circuit 20 and controls the low decoder 32 and the column decoder to perform write control of write data and read control of read data with respect to the flash memory cell 34. The low decoder 32 selects memory cells arranged in a row direction from among memory cells arranged in the form of an array in the flash memory cell 34. The column decoder and a column decoder contained in the sense amplifier 33 select memory cells arranged in a column direction from among memory cells arranged in the form of an array in the flash memory cell 34. The sense amplifier also generates a cell current Cell_I corresponding to data stored in the memory cells selected by the low decoder and column decoder. Further, because the sense amplifier operates based on a power source voltage VDD, the cell current Cell_I is affected by fluctuations of the power source voltage VDD.

The reference current generation circuit 35 has a reference voltage generation circuit 36 and a voltage-current conversion circuit 37. The reference voltage generation circuit 36, for example, has two resistors connected in series between a power source node to which the power source voltage VDD is supplied and a ground node to which a ground voltage GND is supplied and outputs a reference voltage Vref generated between the two resistors. In this case, the resistor used in the reference voltage generation circuit 36 preferably has a comparatively high resistance value to inhibit power consumption. The voltage-current conversion circuit 37 receives the reference voltage Vref and outputs a reference current Ref_I corresponding to the voltage value of the reference voltage Vref. In other words, in the present embodiment, the reference current Ref_I becomes a voltage that maintains a constant ratio with respect to the voltage value of the power source voltage VDD. Furthermore, as will be described below in greater detail, the reference current generation circuit 35 switches a current value of the reference current Ref_I corresponding to the operation mode of the memory module. For example, in verify processing, the value of the reference current Ref_I is outputted by switching between two stages, and in the usual read operation, a reference current Ref_I of a fixed current value is outputted.

The comparator 38 compares a value of the reference current Ref_I and a value of the cell current Cell_I and outputs read data.

The verify determination unit 40 performs quality determination of read data in verify processing. Furthermore, the verify determination unit 40 stores quality determination results and also stores a flag value (for example, a power source abnormality flag value) indicating the efficiency of the quality determination results. The verify determination unit 40 has an expected value storage unit 41, a data comparison unit 42, and a verify result storage unit 43.

The expected value storage unit 41 stores write data during verify processing and outputs them as an expected value to the data comparison unit 42. The data comparison unit 42 compares the expected value and read data for coincidence and determines a match result of the expected value and read data. Furthermore, the data comparison unit 42 outputs the match result as a match result signal A1. The verify result storage unit 43 stores the match result notified by the match result signal A1 and a power source state notified by a power source abnormality detection signal A2 outputted by the below-described power source monitoring circuit 50. The CPU 10 determines a result of verify processing by referring to the match result stored in the verify result storage unit 43 and the power source abnormality flag value. In the present embodiment, a quality determination result of verify processing is configured by the match result and power source abnormality flag value.

The power source monitoring circuit 50 detects that the fluctuations of the power source voltage VDD are equal to or greater than a predetermined variation ratio and outputs the power source abnormality detection signal A2. More specifically, when the gradient of fluctuations of the power source voltage VDD against time is equal to or greater than a predetermined value, the power source monitoring circuit 50 assumes that an abnormality has occurred in the power source and takes the state of the power source abnormality detection signal A2 as a power source abnormality notification state. Then, the verify result storage unit 43 that has received the power source abnormality detection signal A2 in the power source abnormality notification state takes the power source abnormality flag value, for example, as 1. When no fluctuations of the power source voltage VDD are detected in the power source monitoring circuit 50, the power source abnormality detection signal A2 becomes a power source usual notification state. The verify result storage unit 43 that has received the power source abnormality detection signal A2 that has become a power source usual notification state sets the power source abnormality flag value, for example, as 0.

The power source voltage generation circuit 60 is, for example, a regulator circuit. The power source voltage generation circuit 60 receives an external power source and generates an internal power source to be used in the semiconductor device 1. A voltage of the internal power source is called the power source voltage VDD. The generated internal power source is supplied to the CPU 10, control circuit 20, memory module 30, verify determination unit 40, and power source monitoring circuit 50. Furthermore, as shown in FIG. 1, in the memory module 30, the internal power source is also supplied to circuits other than the column decoder, sense amplifier 33, and reference current generation circuit 35. In the memory module 30, a boost pressure obtained by raising the internal power source is generated as a voltage for writing to the flash memory cell 34 (this is not shown in the figure).

Verify processing in the semiconductor device 1 will be explained below in greater detail. First, writing in the flash memory will be explained. Write operation of a flash memory includes two write operations. The first one is the first write operation of write data 1, and the second operation is the second write operation of taking data stored in a cell as a preset initial value (erasing and writing). In the present embodiment, the first write operation and the second write operation will not be specifically distinguished, and the write operation will be assumed to include the two write operation.

In the first write operation, a memory cell threshold is set high and a cell current that will be read out is decreased, and in the second write operation, a memory cell threshold is set low and a cell current that will be read out is increased. In other words, a cell current Cell_I that is read from a memory cell into which data 1 have been written is lower than the cell current Cell_I that is read from a memory cells into which data 0 have been written. For this reason, different reference currents Ref_I are used in the verify processing corresponding to the first write operation and the verify processing corresponding to the second write operation. More specifically, a reference current Ref_I with a small current value is used in the verify processing corresponding to the first write operation, and a reference current Ref_I with a large current value is used in the verify processing corresponding to the second write operation. Meanwhile, the reference current Ref_I used in the usual read operation outside the interval of verify processing has a current value between the two reference currents used in the verify processing.

By thus changing the size of the reference current used correspondingly to data that will be written in a memory cell, it is possible to prevent the inversion of data saved in the memory cell even when fluctuations of cell current caused by the deterioration of memory cell with time have occurred (for example, when a cell current read from a memory cell into which data 1 have been written is increased). In other words, by making data determination in verify processing more stringent than data determination in the usual read operation, it is possible to realize the prevention of no-good write and the increase in durability of data against subsequent deterioration with time.

The above-described verify processing is carried out in a flash memory, but in a flash memory, write data are generated by comparing the reference current Ref_I with the cell current Cell_I. Therefore, a problem created by fluctuations of the power source voltage VDD is that the relationship between the reference current Ref_I and cell current Cell_I is inverted and read data are inverted. The inversion of read data will be described below.

Figure 2:
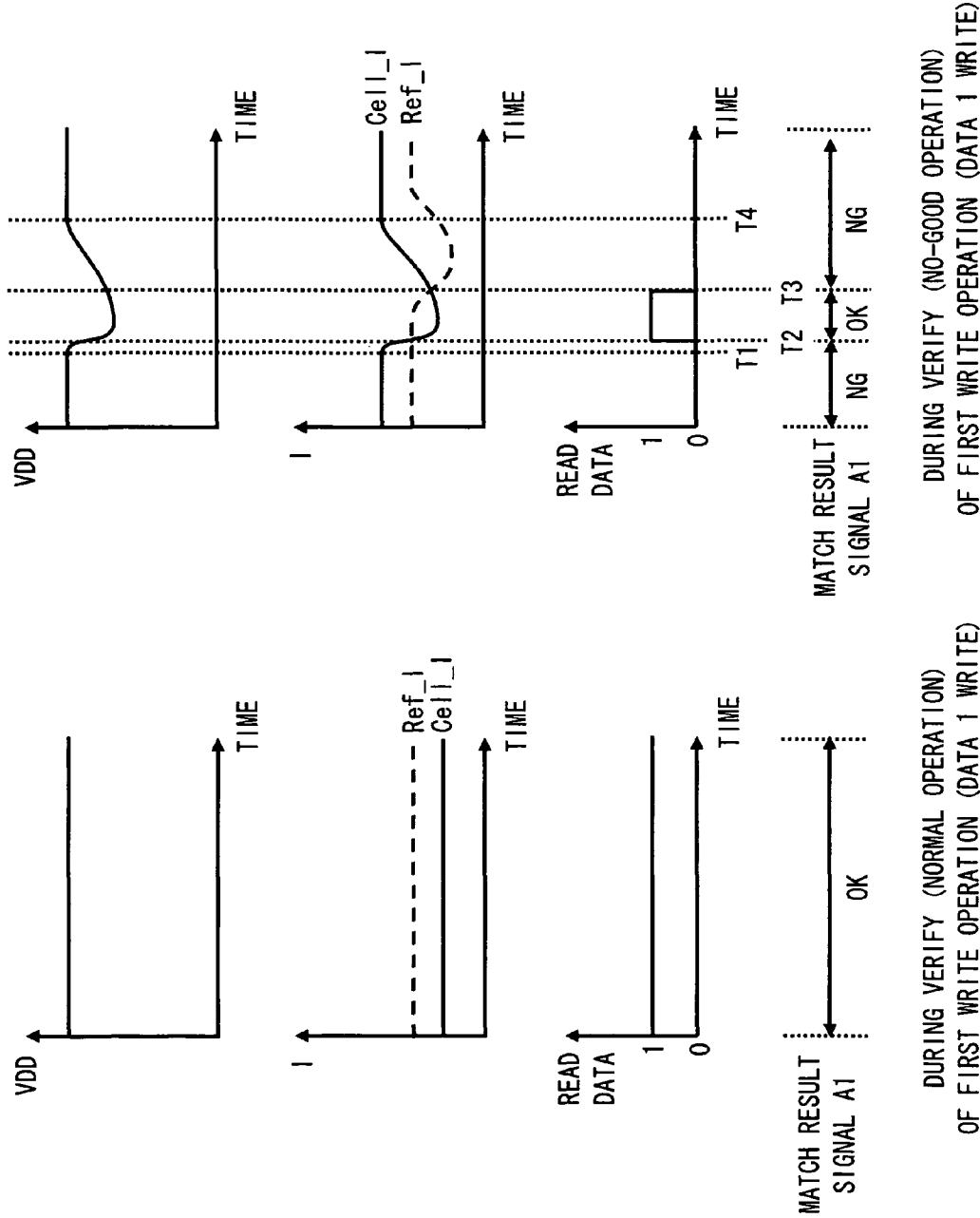
FIG. 2 shows the relationship of the power source voltage, reference current, cell current, and read data during the first write operation in a semiconductor apparatus according to the first exemplary embodiment.

First, the inversion of read data in the first write operation will be explained. FIG. 2 shows the relationship of the power source voltage VDD, reference current Ref_I, cell current Cell_I, and read data during the first write operation. The left drawing in FIG. 2 illustrates the case in which the verify processing is performed normally and the right drawing illustrates the case in which the verify processing is not good.

As shown in the left drawing in FIG. 2, no fluctuations of power source voltage VDD occur in the normal verify operation. Furthermore, because data 1 are normally written into the memory cell in the first write operation, the cell current Cell_I smaller than the reference current Ref_I is read. The read data become 1. Therefore, the match result signal A1 outputted by the data comparison unit 42 indicates a state in which write data and read data coincide (OK).

By contrast, as shown in the right drawing in FIG. 2, when the result of verify processing is not good (NG), the cell current Cell_I is larger than the reference current Ref_I because data 1 are not written normally into the memory cell in the first write operation. As a result, the read data are 0, and the match result signal A1 outputted by the data comparison unit 42 indicates a state in which the write data and read data do not coincide (NG).

However, in the example shown in the right drawing in FIG. 2, fluctuations occur in the power source voltage VDD that is a reason of no-good operation during verify processing. These fluctuations of the power source voltage VDD are generated, for example, due to abrupt variations in a consumed current, such as rush current, generated by the operation of CPU 10. Furthermore, current values of the cell current Cell_I and reference current Ref_I decrease in response to fluctuations of the power source voltage VDD generated at timings T1 to T4. In this case, because fluctuations of the cell current Cell_I have a time constant less than that of fluctuations of the power source voltage VDD, the fluctuations of the cell current almost follow the fluctuations of the power source voltage VDD. By contrast, because the reference current Ref_I is generated by the reference voltage generation circuit 36 from the reference voltage Vref by using a resistor with a comparatively high resistance value, fluctuations of the reference current have a time constant larger than that of fluctuations of the power source voltage VDD. In other words, fluctuations of the reference current Ref_I are delayed with respect to fluctuations of the power source voltage VDD. As a result, an inversion of size relationship between the cell current Cell_I and reference current Ref_I occurs within an interval of timings T2 to T3.

As a consequence, in no-good operation in which fluctuations of power source voltage occur, the match result signal A1 that has indicated the NG state indicates the OK state in the interval of timings T2 to T3. Therefore, when the match result signal A1 within the interval of timings T2 to T3 is stored in the verify result storage unit 43, the result of verify processing becomes erroneous.

Figure 3:
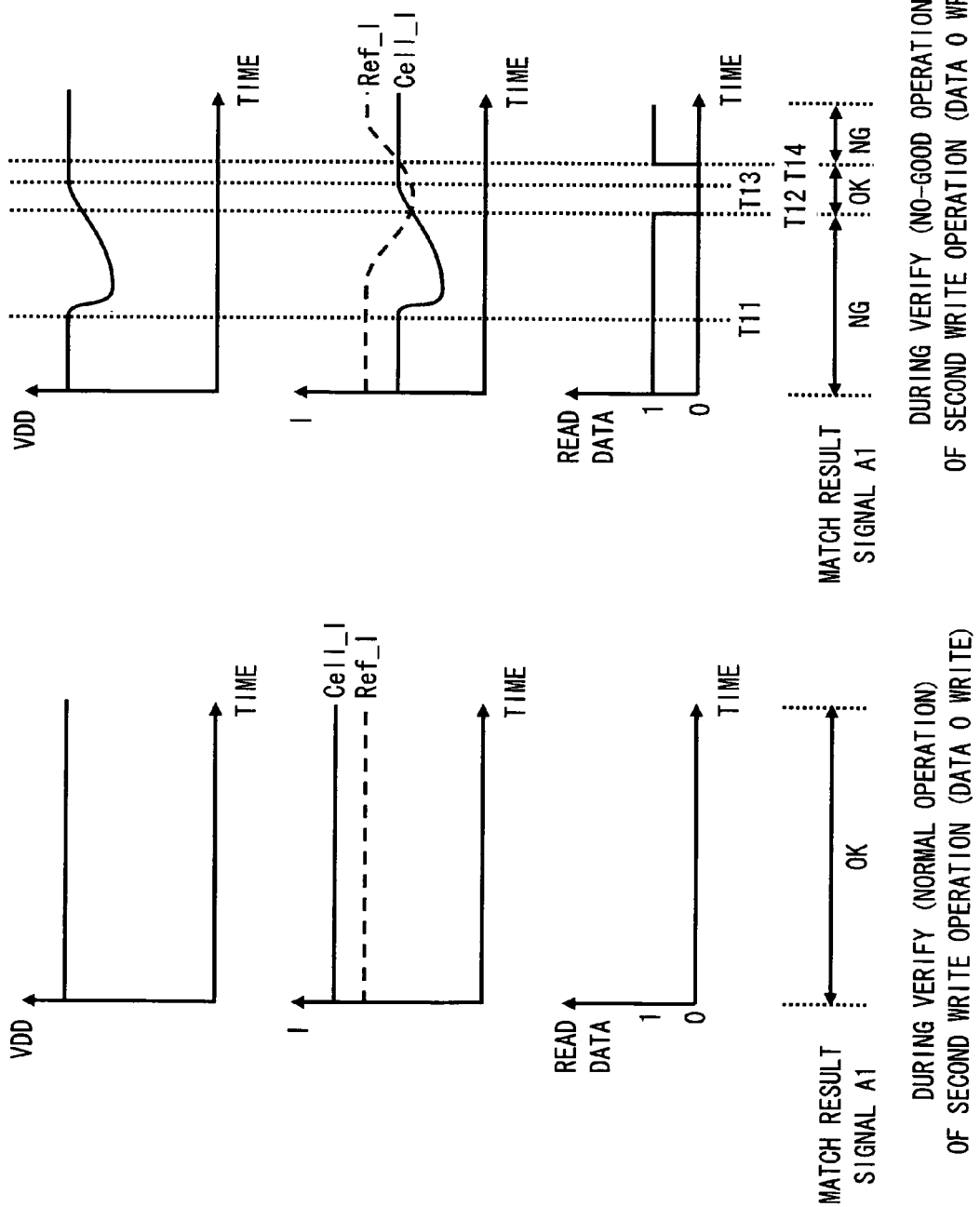
FIG. 3 shows the relationship between the power source voltage, reference current, cell current, and read data during the second write operation in a semiconductor apparatus according to the first exemplary embodiment.

The inversion of read data in the second write operation will be described below. FIG. 3 shows the relationship between the power source voltage VDD, reference current Ref_I, cell current Cell_I, and read data during the second write operation. The left drawing in FIG. 3 illustrates the case in which the verify processing is performed normally and the right drawing illustrates the case in which the verify processing is not good.

As shown in the left drawing in FIG. 3, no fluctuations of power source voltage VDD occur in the normal verify operation. Furthermore, because data 0 are normally written into the memory cell in the second write operation, the cell current Cell_I larger than the reference current Ref_I is read. The read data become 0. Therefore, the match result signal A1 outputted by the data comparison unit 42 indicates a state in which write data and read data coincide (OK).

By contrast, as shown in the right drawing in FIG. 3, when the result of verify processing is not good (NG), the cell current Cell_I is smaller than the reference current Ref_I because data 0 are not written normally into the memory cell in the second write operation. As a result, the read data are 1, and the match result signal A1 outputted by the data comparison unit 42 indicates a state in which the write data and read data do not coincide (NG).

However, in the example shown in the right drawing in FIG. 3, fluctuations occur in the power source voltage VDD that are a reason of no-good operation during verify processing. Furthermore, current values of the cell current Cell_I and reference current Ref_I decrease in response to fluctuations of the power source voltage VDD generated at timings T11 to T13. In this case, because fluctuations of the cell current Cell_I have a time constant less than that of fluctuations of the power source voltage VDD, the fluctuations of the cell current almost follow the fluctuations of the power source voltage VDD. By contrast, because the reference current Ref_I is generated by the reference voltage generation circuit 36 from the reference voltage Vref by using a resistor with a comparatively high resistance value, fluctuations of the reference current have a time constant higher than that of fluctuations of the power source voltage VDD. In other words, fluctuations of the reference current Ref_I are delayed with respect to fluctuations of the power source voltage VDD. As a result, an inversion of size relationship between the cell current Cell_I and reference current Ref_I occurs within an interval of timings T12 to T14.

As a consequence, in a no-good operation in which fluctuations of power source voltage occur, the match result signal A1 that has indicated the NG state indicates the OK state in the interval of timings T12 to T14. Therefore, when the match result signal A1 within the interval of timings T12 to T14 is stored in the verify result storage unit 43, the result of verify processing becomes erroneous.

In the semiconductor device 1 of the present embodiment, a mechanism is provided for preventing erroneous determination in the verify processing caused by fluctuations of the power source voltage VDD such as shown in the right drawing in FIG. 2 and the right drawing in FIG. 3. More specifically, in the semiconductor device 1 of the present embodiment, fluctuations of the power source voltage VDD such as shown in the right drawing in FIG. 2 and the right drawing in FIG. 3 are detected by the power source monitoring circuit 50 in the read interval of data from the flash memory (in particular, during verify processing), and the power source abnormality flag value indicating the detection is associated with the match result notified by the match result signal A1 and stored in the verify result storage unit 43. The CPU 10 thereafter performs the re-verify processing with reference to the match result and power source abnormality flag value stored in the verify result storage unit 43.

FIG. 4 shows a table illustrating the operations performed thereafter by the CPU 10 that refers to the match result and the power source abnormality flag value. As shown in FIG. 4, when the match result indicates coincidence and the power source abnormality flag value indicates 1 (normal), the CPU 10 determines that the write processing is normal and ends the write processing. Furthermore, when the match result indicates coincidence and the power source abnormality flag value indicates 0 (normal), the CPU 10 instructs the control circuit 20 to perform only the verify processing again in order to confirm the reliability of verify processing. When the match result indicates lack of coincidence and the power source abnormality flag value indicates 1 (normal), the CPU 10 determines that the write processing has failed and instructs the control circuit 20 to perform the retry write processing. Furthermore, when the match result indicates lack of coincidence and the power source abnormality flag value indicates 0 (abnormal), the CPU 10 determines that the write processing has failed or that the reliability of verify processing is low and instructs the control circuit 20 to perform the retry write processing.

Figure 5:
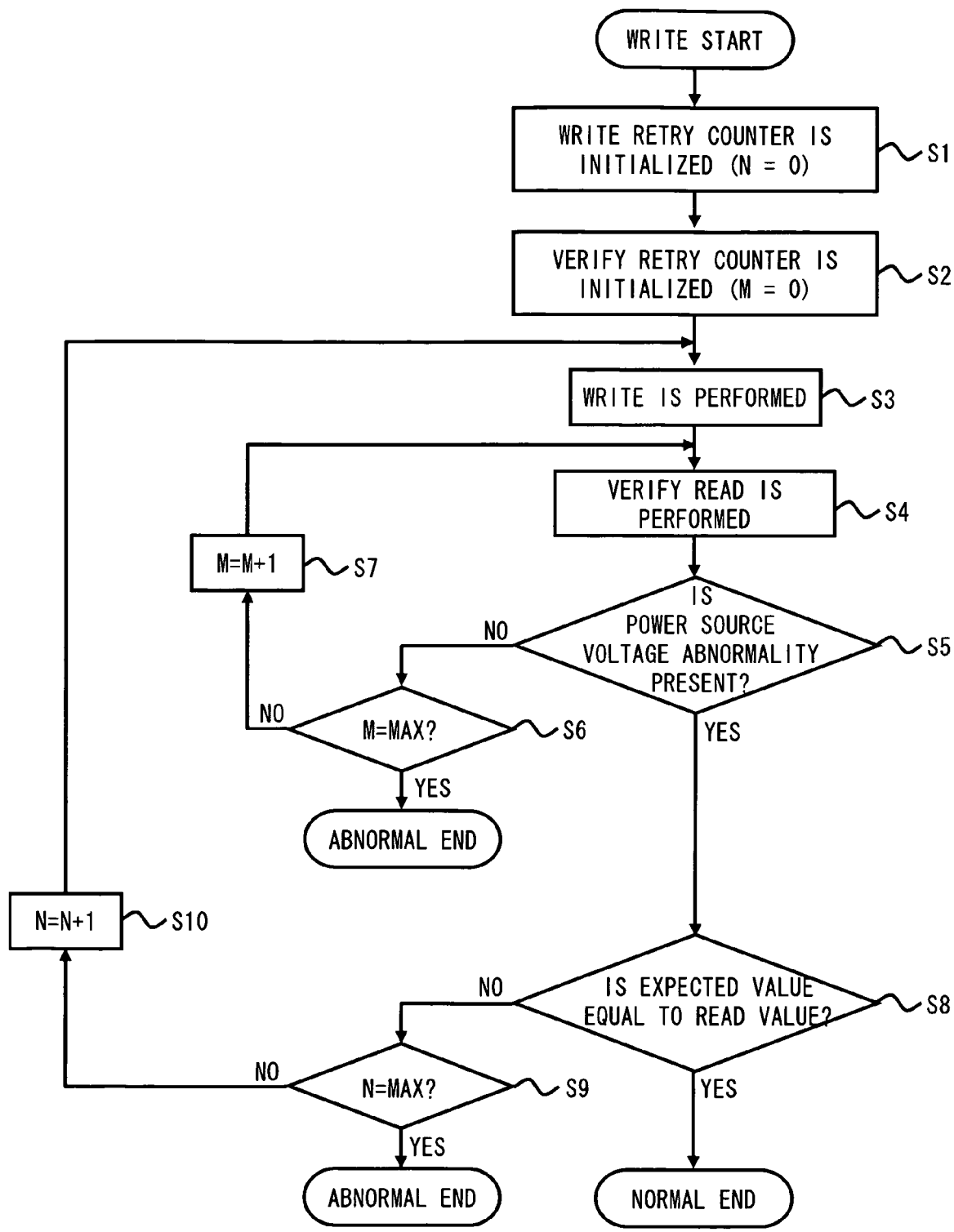
FIG. 5 shows a flowchart of a write operation and verify operation in a semiconductor apparatus according to the first exemplary embodiment.

The above-described processing in which the read processing and verify processing are performed in series is shown as a flowchart in FIG. 5. As shown in FIG. 5, when a read operation is started in the semiconductor device 1, first, the CPU 10 sets the count values N and M stored in the CPU 10 or in a memory device not shown in the figure to 0, thereby initializing a write retry counter and a verify retry counter (steps S1 and S2). Then, the CPU 10 instructs the control circuit 20 to perform a write operation, and a write processing is performed (step S3). The control circuit 20 then performs a verify read operation for verify processing and reads read data corresponding to write data that have been written (step S4). The match result signal A1 of the expected value corresponding to write data and the read data that have been read in step S4 is outputted by the data comparison unit 42, and the match result is stored in the verify result storage unit 43. Furthermore, the power source monitoring circuit 50 monitors power source abnormalities during verify read and sets the power source abnormality flag value of the verify result storage unit 43 on the basis of the detection result of power source abnormalities.

The CPU 10 then determines whether the write operation of step S3 is normal by referring to the results of verify processing of step S4. In this determination, it is first determined whether an abnormality is present in the power source voltage VDD (step S5). The processing of step S5 will be described below in greater detail. The CPU 10 refers to the power source abnormality flag value of the verify result storage unit 43. Then, if the power source abnormality flag value is 0, it is determined that there is no abnormality that decreases reliability of verify results in the power source voltage VDD (Yes branch of step S5). However, if the power source abnormality flag value is 1, it is determined that an abnormality decreasing reliability of verify results in the power source voltage VDD has occurred during verify processing (No branch of step S5).

Where the processing flow has moved to the No branch of step S5, the CPU 10 refers to the verify retry count value M and determines whether the verify retry count value M has reached a maximum value MAX (step S6). If it is determined that the verify retry count value M has not yet reached the maximum value MAX in this step S6 (No branch of step S6), the verify retry count value M is incremented by 1 (step S7). Furthermore, a command to execute the verify processing again is issued to the control circuit 20 (step S4). However, if it is determined that the verify retry count value M has reached the maximum value MAX in this step S6 (Yes branch of step S6), the write operation is determined to have failed and the write processing is abnormally ended.

Where the processing flow has moved to the Yes branch of step S5, the CPU 10 determines the compliance of read data (step S8). As for specific processing of step S8, the CPU 10 refers to the match result of the verify result storage unit 43, and the CPU 10 determines whether the match result indicates coincidence or lack of coincidence. When it is determined in step S8 that the match result indicates coincidence (Yes branch of step S8), the CPU 10 determines that the write processing has been performed normally and normally ends the write processing. However, when it is determined in step S8 that the match result indicates lack of coincidence (No branch of step S8), the CPU 10 refers to the write retry counter value N and determines whether the write retry counter value N has reached a maximum value MAX (step S9). If it is determined in this step S9 that the write retry counter value N has not yet reached the maximum value MAX (No branch of step S9), the write retry counter value N is incremented by 1 (step S10). Furthermore, a command to execute a retry write processing is issued to the control circuit 20 (step S3). However, if it is determined in step S9 that the write retry counter value N has reached the maximum value MAX (Yes branch of step S9), the write operation is determined to have failed and the write processing is abnormally ended.

The explanation above demonstrates that in the semiconductor device 1 of the present embodiment, fluctuations of the power source voltage VDD during verify processing are monitored by the power source monitoring circuit 50. Furthermore, the power source monitoring circuit 50 sets a value indicating an abnormality of the power source as the power source abnormality flag value in the verify determination unit 40 when the power source voltage VDD during verify processing demonstrates fluctuations equal to or greater than a predetermined variation rate. As a result, the verify determination unit 40 can indicate the reliability of the match result regardless of whether the match result signal A1 indicates coincidence or lack of coincidence of the write data and read data. In other words, when a power source abnormality decreasing the reliability of match result has occurred, the verify determination unit 40 can invalidate the match result. In other words, in the semiconductor device 1 of the present embodiment, the reliability of verify processing can be increased.

Further, in the semiconductor device 1 of the present embodiment, because the match result and power source abnormality flag value are stored in the verify result storage unit 43, the CPU 10 that refers to these values can determine the subsequent retry processing according to the abnormality state. In the explanation above, when the reliability of verify processing is low, only verify processing can be executed, and when the read processing fails or read data are not good, the retry write processing can be executed. By performing such retry processing, it is possible to shorten the retry processing time in the semiconductor device 1. More specifically, in the conventional semiconductor device, when the verify processing result is NG, it is impossible to determine whether this NG originates in a power source abnormality or a failure of write processing. Therefore, in the conventional semiconductor device, when the verify processing result is NG, it is necessary to perform both the retry write and the verify processing. By contrast, in the semiconductor device 1 of the present embodiment, a power source abnormality occurring during verify processing can be detected. Therefore, when a power source abnormality is detected, it is possible to execute only the verify processing that is completed within a period shorter than that of the write processing. If compliance of read data is confirmed by the result of re-verify processing, the normal write operation can be shortened by ending the write operation at this point in time. Furthermore, executing only the verify processing yields the following merits: a write stress to the memory cell can be reduced, the increase in the number of rewrite cycles is inhibited, and save properties of the memory cell are improved.

Second Exemplary Embodiment

Figure 6:
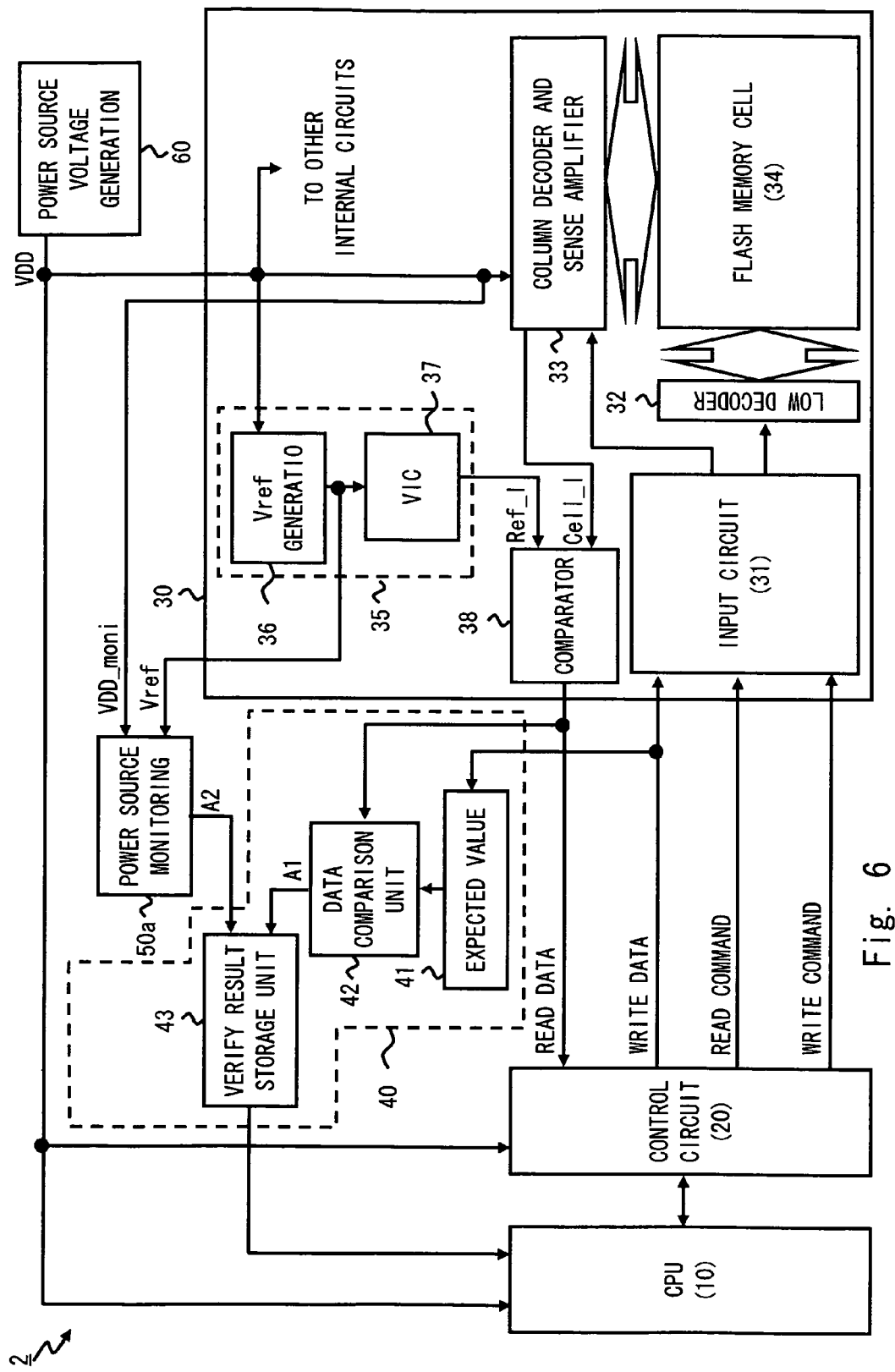
FIG. 6 is a block diagram showing a semiconductor apparatus according to a second exemplary embodiment.
Figure 7:
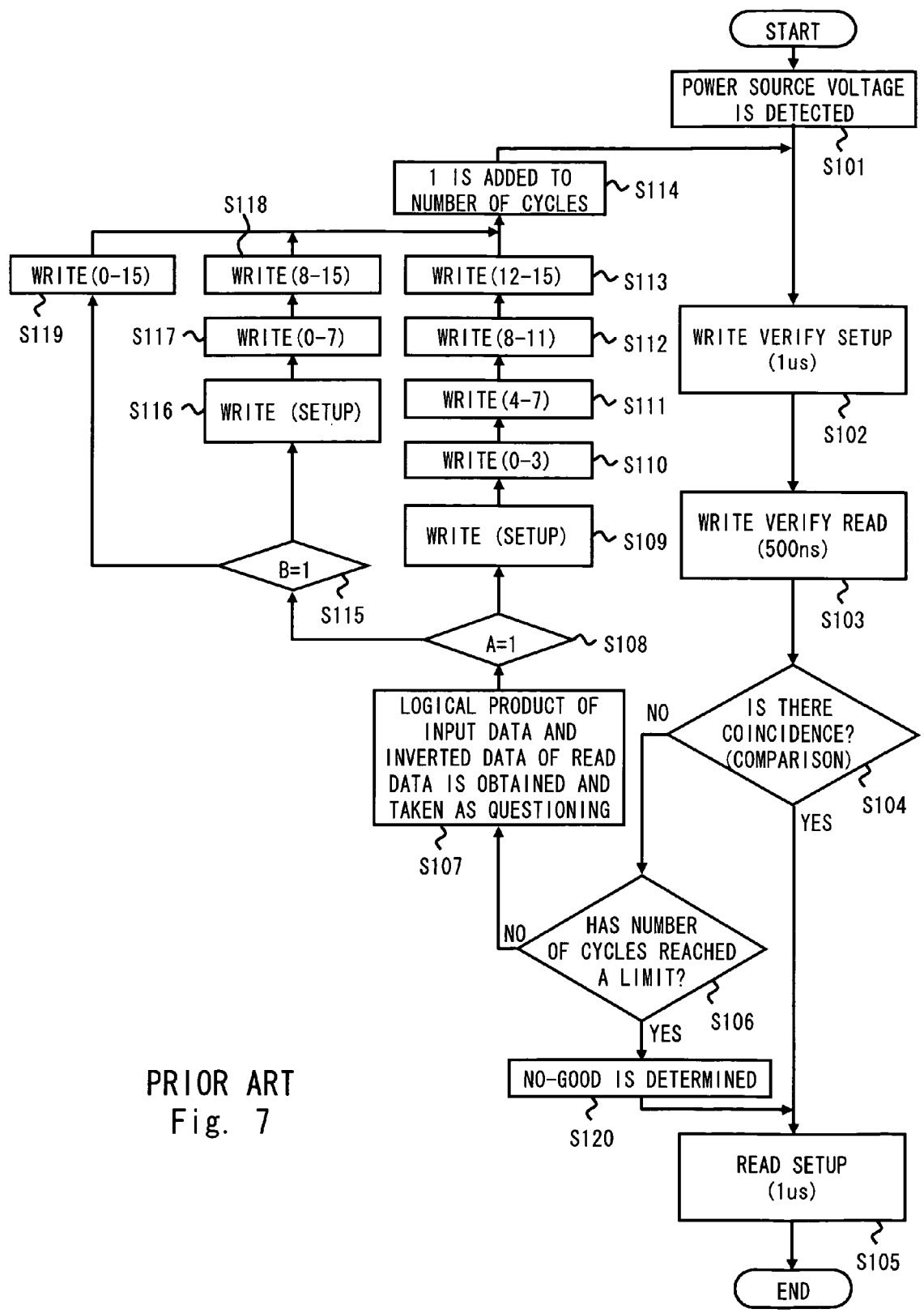
FIG. 7 shows a flowchart of verify operation in a semiconductor apparatus according to Japanese Unexamined Patent Application Publication No. H11-306774.

FIG. 6 shows a block diagram of a semiconductor device 2 of a second exemplary embodiment. As shown in FIG. 6, the semiconductor device 2 has a power source monitoring circuit 50a, which is a modification example of the power source monitoring circuit 50 of the first exemplary embodiment. The power source monitoring circuit 50a detects fluctuations of a power source voltage VDD on the basis of a reference voltage Vref generated in a reference voltage generation circuit 35 and a power source voltage VDD_moni in the vicinity of a sense amplifier.

The power source voltage VDD supplied to the sense amplifier makes a large contribution to fluctuations of a cell current Cell_I. Furthermore, a power source wiring to the sense amplifier is typically long, and a voltage drop occurs in a path from an output terminal of a power source voltage generation circuit 60 to the sense amplifier. As a result, by detecting the power source voltage VDD_moni in the vicinity of the sense amplifier, the power source monitoring circuit 50a can detect fluctuations of the cell current Cell_I with an accuracy higher than that attained in the power source monitoring circuit 50.

The power source monitoring circuit 50a also monitors fluctuations of a reference voltage Vref that makes a large contribution to fluctuations of a reference current Ref_I. Thus, by monitoring the power source voltage VDD_moni and the reference voltage Vref, the power source monitoring circuit 50a can monitor in greater detail the relationship between fluctuations of the reference current Ref_I and fluctuations of the cell current Cell_I. In other words, even when fluctuations of the power source voltage VDD occur, the power source monitoring circuit 50a can select not to notify about a power source abnormality, provided that the relationship between a fluctuation amount of the power source voltage VDD_moni and a fluctuation amount of the reference voltage Vref does not cause the inversion of the size relationship of the cell current Cell_I and the reference current Ref_I. As a result, in the semiconductor device 2, the unnecessary retry processing can be prevented and processing capacity can be increased.

The first and second exemplary embodiments can be combined as desirable by one of ordinary skill in the art. Furthermore, in the power source monitoring circuits 50 and 50a, a power source voltage is monitored, but a configuration may be also employed in which only the reference voltage Vref is monitored instead of the power source voltage. This is because the reference voltage Vref in the explanation above is generated based on the power source voltage VDD and follows fluctuations of the power source voltage VDD. In other words, the power source monitoring circuits 50 and 50a in accordance with the present invention may monitor a voltage fluctuating in relationship with fluctuations of the power source voltage VDD.

Further, in the explanation above, the CPU 10 and control circuit 20 are explained as separate circuit blocks, but the CPU 10 may have a configuration including the control circuit 20. Moreover, whether to perform the retry write operation and re-verify operation may be determined by the control circuit 20.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that Applicant's intent is to encompass equivalents of all claim elements, even if amended later during prosecution.

What is claimed is:

1. A semiconductor device comprising:
a memory module including a reference current generation circuit that generates a reference current on the basis of a power source voltage and a comparator that compares a cell current read from one of a plurality of memory cells with the reference current and generates read data;
a verify determination unit that performs quality determination of the accuracy of read data that have been read from the memory cells on the basis of the read data and an expected value prepared in advance; and
a power source monitoring circuit that detects fluctuations equal to or greater than a predetermined variation rate in a power source voltage supplied to the memory module and outputs a power source abnormality detection signal,
wherein the power source monitoring circuit detects fluctuations equal to or greater than a predetermined variation rate in the power source voltage and fluctuations equal to or greater than a predetermined variation rate in a reference voltage used for generating the reference current, and outputs the power source abnormality detection signal, and
wherein the verify determination unit invalidates a result of the quality determination when the power source abnormality detection signal indicates an abnormal state of the power source voltage.

2. The semiconductor device according to claim 1, further comprising:
an operational circuit using the memory module as a memory device; and
a control circuit that receives a command from the operational circuit and controls the memory module,
wherein the operational circuit instructs the control circuit to perform a verify operation again when the result of the quality determination is invalidated in the verify determination unit.

3. The semiconductor device according to claim 2,
wherein the operational circuit instructs the control circuit to perform a retry write operation when the result of the quality determination in the verify determination unit indicates a mismatch of the read data and the write data.

4. The semiconductor device according to claim 2,
wherein the verify determination unit has:
a data comparison unit that outputs a match result signal indicating a match result of the read data and write data relating to the memory cell; and
a verify result storage unit that stores the match result notified by the match result signal and a power source abnormality flag value notified by the power source abnormality detection signal,
and wherein the operational circuit refers to the match result and the power source abnormality flag value that are stored in the verify result storage unit.

5. The semiconductor device according to claim 1, further comprising:
an operational circuit using the memory module as a memory device; and
a control circuit that receives a command from the operational circuit and controls the memory module,
wherein the operational circuit instructs the control circuit to perform a retry write operation when the result of the quality determination is invalidated in the verify determination unit.

6. The semiconductor device according to claim 1, wherein the power source monitoring circuit monitors fluctuations of the power source voltage used for generating the cell current.

7. The semiconductor device according to claim 1, wherein the predetermined variation rate is a variation rate of the power source voltage at which inversion occurs between a value of the cell current and a value of the reference current due to fluctuations of the power source voltage.

8. The semiconductor device according to claim 1, wherein the power source monitoring circuit monitors fluctuations of the power source voltage in a period of reading read data from the memory cell.

9. The semiconductor device according to claim 1, wherein the memory cell is a flash memory.

10. The semiconductor device according to claim 1, wherein the verify determination unit invalidates a result of the quality determination regardless of the read data when the power source abnormality detection signal indicates an abnormal state of the power source voltage.

11. The semiconductor device according to claim 1, wherein the power source monitoring circuit determines whether an abnormality of the power source voltage is present or not after read processing of the read data by the verify determination unit.

12. The semiconductor device according to claim 1, wherein the power source monitoring circuit monitors fluctuations of the power source voltage in the vicinity of a sense amplifier that generates the cell current according to a storage state of the plurality of memory cells.

* * * * *